(12) United States Patent
Park et al.

(10) Patent No.: US 10,753,975 B2
(45) Date of Patent: Aug. 25, 2020

(54) APPARATUS FOR DIAGNOSING RELAY FAILURE OF BATTERY USING PARALLEL CIRCUIT FOR CONSTANT POWER SUPPLY AND METHOD THEREOF

(71) Applicant: LG CHEM, LTD., Seoul (KR)

(72) Inventors: Jong-Il Park, Daejeon (KR); You-Seob Gil, Daejeon (KR); Sun-Mo An, Daejeon (KR)

(73) Assignee: LG CHEM, LTD., Seoul (KR)

( * ) Notice: Subject to any disclaimer, the term of this patent is extended or adjusted under 35 U.S.C. 154(b) by 66 days.

(21) Appl. No.: 16/094,175

(22) PCT Filed: Dec. 12, 2017

(86) PCT No.: PCT/KR2017/014589
§ 371 (c)(1),
(2) Date: Oct. 16, 2018

(87) PCT Pub. No.: WO2018/110955
PCT Pub. Date: Jun. 21, 2018

(65) Prior Publication Data
US 2019/0128965 A1    May 2, 2019

(30) Foreign Application Priority Data
Dec. 12, 2016  (KR) .......................... 10-2016-0168495

(51) Int. Cl.
*G01R 31/327*   (2006.01)
*H01M 10/42*    (2006.01)
(Continued)

(52) U.S. Cl.
CPC ... *G01R 31/3278* (2013.01); *G01R 19/16542* (2013.01); *H01M 10/425* (2013.01);
(Continued)

(58) Field of Classification Search
None
See application file for complete search history.

(56) References Cited

U.S. PATENT DOCUMENTS

2006/0021098 A1\* 1/2006 Tezuka ................ H01H 47/002
477/7
2007/0115604 A1   5/2007 Zettel et al.
(Continued)

FOREIGN PATENT DOCUMENTS

JP   2011-176958 A   9/2011
JP   2011-217543 A   10/2011
(Continued)

OTHER PUBLICATIONS

International Search Report (PCT/ISA/210) issued in PCT/KR2017/014589, dated Apr. 11, 2018.

*Primary Examiner* — Jas A Sanghera
(74) *Attorney, Agent, or Firm* — Birch, Stewart, Kolasch & Birch, LLP (57) ABSTRACT

Disclosed is an apparatus and method for diagnosing a failure of a relay for a battery required to constantly supply the power to a vehicle with guaranteeing the constant power supply using a parallel circuit. The apparatus of the present disclosure includes a control unit which when voltage and current of a parallel unit is 0 in first state in which a relay unit is in closed state and the parallel unit is in open state, controls into second state in which the relay unit is in closed state and the parallel unit is in closed state, and when the voltage of the parallel unit is equal to voltage of the battery and the current of the parallel unit is 0 in the second state, controls into third state in which the relay unit is in open state and the parallel unit is in closed state, and when the current of the parallel unit is equal to current of the relay unit in the third state, determines a switch of the relay unit to be normal, and when the current of the parallel unit is 0, (Continued)

determines the switch of the relay unit to be faulty, a relay unit through which the current of the battery flows in closed state of the switch to supply the power, and a parallel unit which applies the current of the battery in closed state instead of the relay unit in open state in which the power supply is stopped.

13 Claims, 5 Drawing Sheets

(51) Int. Cl.
    *G01R 19/165*      (2006.01)
    *H02J 7/00*      (2006.01)
    *H01M 10/48*      (2006.01)
    *G01R 31/396*      (2019.01)

(52) U.S. Cl.
    CPC .............. *H02J 7/00* (2013.01); *G01R 31/396* (2019.01); *H01M 10/482* (2013.01); *H01M 2010/4271* (2013.01); *H01M 2220/20* (2013.01)

(56) References Cited

U.S. PATENT DOCUMENTS

| | | |
|---|---|---|
| 2007/0139005 A1 | 6/2007 | Osawa |
| 2013/0116875 A1 | 5/2013 | Oh et al. |
| 2015/0054516 A1 | 2/2015 | Iisaka |
| 2015/0316617 A1 | 11/2015 | Shiraishi et al. |
| 2016/0223614 A1 | 8/2016 | Fukumoto et al. |

FOREIGN PATENT DOCUMENTS

| | | |
|---|---|---|
| JP | 2015-8600 A | 1/2015 |
| JP | 2015-95442 A | 5/2015 |
| KR | 10-0867834 B1 | 11/2008 |
| KR | 10-2012-0005729 A | 1/2012 |
| KR | 10-2014-0136844 A | 12/2014 |
| KR | 10-2015-0051496 A | 5/2015 |
| KR | 10-2015-0137677 A | 12/2015 |
| KR | 10-1602434 B1 | 3/2016 |
| KR | 10-2016-0103294 A | 9/2016 |
| KR | 10-2016-0113019 A | 9/2016 |
| KR | 10-2016-0121079 A | 10/2016 |

\* cited by examiner

APPARATUS FOR DIAGNOSING RELAY FAILURE OF BATTERY USING PARALLEL CIRCUIT FOR CONSTANT POWER SUPPLY AND METHOD THEREOF

TECHNICAL FIELD

The present application claims priority to Korean Patent Application No. 10-2016-0168495 filed in the Republic of Korea on Dec. 12, 2016, the disclosures of which are incorporated herein by reference.

The present disclosure relates to relay failure diagnosis, and more particularly, to an apparatus and method for diagnosing a failure of a relay of a battery required to constantly supply the power, with nonstop power supply from the battery through a parallel circuit.

BACKGROUND ART

For safety of 12V LISB batteries mounted in vehicles, relays are provided. 12V LISB batteries are different from 12V lead accumulators and high voltage batteries. 12V lead accumulators have been long used for a long time and safety is guaranteed, so relays for preventing danger are absent in the battery system. In case of 12V LISB batteries, development is in progress and danger still exists, and to avoid danger, relays are provided. Additionally, 12V LISB batteries are a low voltage battery, and opposed to conventional high voltage battery, they constantly supply power to ECU after being mounted in the vehicle.

Particularly, in the case of electric vehicles, 12V LISB batteries (hereinafter referred to as "12V batteries") must constantly supply power to the vehicles. For example, when power supply from 12V battery is stopped while driving, a dangerous situation occurs in which the vehicle stop driving and electrical operations such as handle manipulation and brake manipulation stop. When power supply from 12V battery is stopped, a phenomenon occurs in which the ECU system in the vehicle is reset. That is, even in parking state in which the ECU system is off, when power supply is stopped, the ECU system is reset and information of the vehicle (e.g., car seat position information, radio frequency information, driving distance information and information stored by a user, etc.) is deleted. Accordingly, open of the relay should take place only in an intended situation such as vehicle repair and explosion prevention of the 12V battery. That is, when a dangerous situation such as a battery explosion is sensed, open of the relay is necessarily required.

However, 12V batteries have been manufactured for the purpose of long-term use (e.g., 7 years or longer), and during the long-term use, relays of 12V batteries are maintained in closed state most of the time, and relays have hardly any chance to be controlled into open state, failing to identify if open/closed of relays normally works.

DISCLOSURE

Technical Problem

The present disclosure is devised under the recognition of the conventional problem such as the foregoing, and therefore the present disclosure is directed to providing an apparatus and method for detecting a failure by controlling the open and closed operation of a switch of a relay in a state that power supply is constantly maintained after power from a battery is applied through a parallel circuit when the relay is open.

The present disclosure aims to detect a failure in a switch of a relay for a battery required to constantly supply the power to a vehicle in a state that parking state is sensed and power from the battery is applied to the vehicle through a parallel circuit.

Technical Solution

According to an aspect, an apparatus for diagnosing a failure of a relay required for constant power supply of a battery includes a control unit which controls into first state in which a relay unit is in closed state and a parallel unit is in open state, and when voltage and current of the parallel unit is 0 in the first state, controls into second state in which the relay unit is in closed state and the parallel unit is in closed state, and when the voltage of the parallel unit is equal to voltage of the battery and the current of the parallel unit is 0 in the second state, controls into third state in which the relay unit is in open state and the parallel unit is in closed state, and when the current of the parallel unit is equal to current of the relay unit in the third state, determines a switch of the relay unit to be normal, and when the current of the parallel unit is 0, determines the switch of the relay unit to be faulty, a relay unit which switches the switch to open or closed state by control of the control unit, the relay unit through which the current of the battery flows in closed state to supply the power, a parallel unit which switches the switch to open or closed state by control of the control unit, and applies the current of the battery in closed state instead of the relay unit in open state in which the power supply is stopped, a parallel unit voltage sensing unit which senses the voltage of the parallel unit and outputs the same to the control unit, and a parallel unit current sensing unit which senses the current of the parallel unit and outputs the same to the control unit.

The apparatus further includes a battery current sensing unit which senses the current of the battery and outputs the same to the control unit, wherein when the control unit determines that the current of the battery received in the first state is equal to or less than a preset current, the control unit determines whether to control into the second state.

The apparatus is a Battery Management System (BMS) apparatus of an automotive battery, and when the received current of the battery is equal to or less than the preset current, the control unit determines that the vehicle is in parking state, and determines whether to control into the second state.

The control unit controls the relay unit into closed state to maintain constant power supply of the battery, and if necessary, in a state that the control unit controls the parallel unit into closed state, the control unit controls the relay unit into open state.

When the control unit determines that the current of the parallel unit is not 0 in the controlled second state, the control unit determines that the switch of the relay is faulty in eternal open state.

The apparatus further includes a battery voltage sensing unit which senses the voltage of the battery and outputs the same to the control unit, wherein when the voltage of the parallel unit is equal to the voltage of the battery and the current of the parallel unit is 0 in the controlled second state, the control unit determines the second state to be normal.

In the second state, because resistance of the relay unit is smaller than resistance of the parallel unit and the current of the battery flows through the relay unit, the sensed current of the parallel unit is 0.

The control unit receives inputs of voltage and current of the parallel unit in the controlled third state, and when the voltage of the parallel unit is equal to the voltage of the battery and the current of the parallel unit is equal to the current of the battery, the control unit determines the third state to be normal.

In the third state, because the current of the battery flows through the parallel unit instead of the relay unit in open state, the current of the parallel unit is equal to the current of the battery.

When the current of the parallel unit is not equal to the current of the battery in the third state, the control unit determines that the switch of the relay is faulty in eternal closed state.

The apparatus further includes a diode unit connected to the parallel unit to prevent backward voltage, wherein the current outputted from the parallel unit flows through the diode unit.

According to another aspect, a BMS apparatus for diagnosing a failure of a relay required for constant power output of a battery, includes a control unit which controls into first state in which a relay circuit is in closed state and a parallel circuit is in open state, and when voltage and current of the parallel circuit is 0 in the first state, controls into second state in which the relay circuit is in closed state and the parallel circuit is in closed state, and when the voltage of the parallel circuit is equal to voltage of the battery and the current of the parallel circuit is 0 in the second state, controls into third state in which the relay circuit is in open state and the parallel circuit is in closed state, and when the current of the parallel circuit is equal to a current of the relay circuit in the third state, determines a switch of the relay circuit to be normal, and when the current of the parallel circuit is 0, determines the switch of the relay circuit to be faulty, a relay circuit which switches the switch to open or closed state by control of the control unit, the relay circuit through which the current of the battery flows in closed state to supply the power, a parallel circuit connected to an input terminal of the relay circuit, the parallel circuit which switches the switch to open or closed state by control of the control unit, and applies the current of the battery in closed state instead of the relay circuit in which the power supply is stopped, a voltage sensing circuit connected to an output terminal of the parallel circuit to sense the voltage of the parallel circuit and outputs the same to the control unit, and a current sensing circuit connected to the output terminal of the parallel circuit to sense the current of the parallel circuit and output the same to the control unit.

According to still another aspect, a method for diagnosing a failure of a relay required for constant power output by an apparatus, includes controlling into first state in which a switch of a relay circuit is in closed state and a switch of a parallel circuit is in open state, determining the first state to be normal when the sensed voltage and current of the parallel circuit is 0 in the controlled first state, controlling into second state in which the relay circuit is in closed state and the parallel circuit is in closed state when the first state is determined to be normal, determining the second state to be normal when the sensed voltage of the parallel circuit is equal to voltage of the battery and the current of the parallel circuit is 0 in the controlled second state, controlling into third state in which the relay circuit is open state and the parallel circuit is closed state when the second state is determined to be normal, determining the switch of the relay circuit to be normal when the sensed current of the parallel circuit is equal to a current of the relay circuit in the controlled third state, and determining the switch of the relay circuit to be faulty when the current of the parallel circuit is 0.

Advantageous Effects

According to an aspect of the present disclosure, a relay switch failure is diagnosed by performing the switching operation of the relay in a state that power supply from a battery constantly supplying power is guaranteed using a parallel circuit.

Additionally, in parking state in which a vehicle is in idle state, the parallel circuit diagnoses a relay failure with guaranteeing the power supply of the battery requiring constant power supply to the vehicle, thereby protecting the battery and the vehicle.

Additionally, when a relay switch failure is diagnosed, damage to the vehicle and a driver can be prevented when the driver drives the vehicle without knowing a state in which the switch of the relay is in melted state and cannot be opened, and the relay is not opened in a dangerous situation such as a battery explosion.

BRIEF DESCRIPTION OF THE DRAWINGS

The accompanying drawings illustrate the preferred embodiment of the present disclosure and together with the following detailed description, serve to provide further understanding of the technical aspects of the present disclosure, and thus, the present disclosure is not construed as being limited to the statements in such drawings.

MODE FOR CARRYING OUT THE INVENTION

Hereinafter, the preferred embodiments of the present disclosure will be described in detail with reference to the accompanying drawings. Prior to the description, it should be understood that the terms or words used in the specification and the appended claims should not be construed as limited to general and dictionary meanings, but interpreted based on the meanings and concepts corresponding to the technical aspects of the present disclosure on the basis of the principle that the inventor is allowed to define terms appropriately for the best explanation. Therefore, the embodiments described herein and illustrations shown in the drawings are just a most preferred embodiment of the present disclosure, but not intended to fully describe the technical aspects of the present disclosure, so it should be understood that other equivalents and modifications could be made thereto at the time the application was filed.

Figure 1:
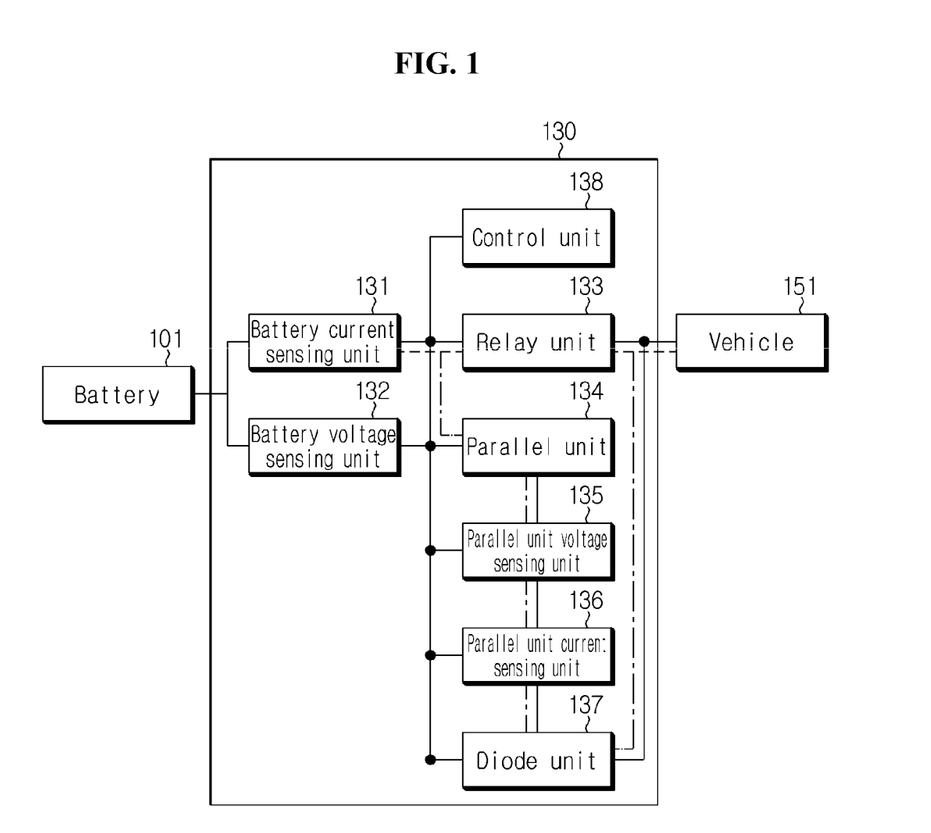
FIG. 1 is a schematic configuration diagram of an apparatus according to an embodiment of the present disclosure.

FIG. 1 is a schematic configuration diagram of an apparatus 130 according to an embodiment of the present disclosure.

The apparatus 130 according to an embodiment of the present disclosure includes a battery current sensing unit 131, a battery voltage sensing unit 132, a relay unit 133, a parallel unit 134, a parallel unit voltage sensing unit 135, a parallel unit current sensing unit 136, a diode unit 137 and a control unit 138 to diagnose a switch failure of a relay.

The battery 101 is a battery required to constantly supply the power. For example, the battery 101 is a 12V LISB battery mounted in a vehicle 151 to constantly supply power to an engine control unit (ECU) system of the vehicle 151. After the battery 101 is mounted in the vehicle 151, the battery 101 always supplies power to the vehicle 151 when the vehicle 151 is driving and parked as well as when the ECU system is powered off. In the case of the 12V LISB battery, a battery module may be connected and extended to 24V, 36V and 48V.

The apparatus 130 enables the control unit 138 to control the constant power supply of the battery 101. The apparatus 130 may be implemented as a BMS apparatus that manages the charge and discharge of the battery. The control unit 138 is connected to each component 131~137, and transmits and receives various signals and data, and manages and controls the operation and function of each component 131~137.

Here, the control unit 138 controls the relay unit 133 into closed state to allow the battery 101 to continuously supply power to the vehicle 151. When the relay unit 133 receives an input of a control signal of closed state from the control unit 138, the relay unit 133 switches the relay switch to ON state. The relay unit 133 controlled into closed state provides a path along which the current outputted from the battery 101 flows to the vehicle 151. That is, the current outputted from the battery 101 is applied to flow toward the vehicle 151 through the relay unit 133.

In the present disclosure, the switch of the relay unit 133 should be switched to OFF state in a dangerous situation such as an explosion of the battery 101 or an intended situation. To this end, the control unit 138 is required to periodically diagnose the ON and OFF operation of the relay switch. Of course, the diagnosis process involves the open state of the relay unit 133 to test the OFF operation of the relay switch.

However, when the relay unit 133 is in open state, the vehicle 151 is not supplied with power from the battery 101 through the relay unit 133. To prevent this, for the vehicle 151 to be always supplied with power from the battery 101, the control unit 138 controls the parallel unit 134 into closed state when the relay unit 133 is in open state, so that the current outputted from the battery 101 flows to the vehicle 151 through the parallel unit 134. That is, the current outputted from the battery 101 flows to the vehicle 151 via a parallel path or a bypass path through the parallel unit 134 in closed state instead of the relay unit 133 in open state. Thus, the control unit 138 controls at least one of the relay unit 133 and the parallel unit 134 into closed state so that the vehicle 151 is constantly supplied with power from the battery 101.

The vehicle 151 is constantly supplied with power from the battery 101. Of course, various types of electronic devices, equipment and systems that need to be constantly supplied with power from the battery 101 may replace the vehicle 151. For example, instead of the vehicle 151, a device such as a sensor device and a monitoring device to which power supply should be always maintained may be connected to the apparatus 130.

Hereinafter, under the assumption that the battery 101 is embedded in the vehicle 151 and the apparatus 130 is a BMS that manages the charge and discharge of the battery 101, the operation of each component 131 is described in detail.

Figure 2:
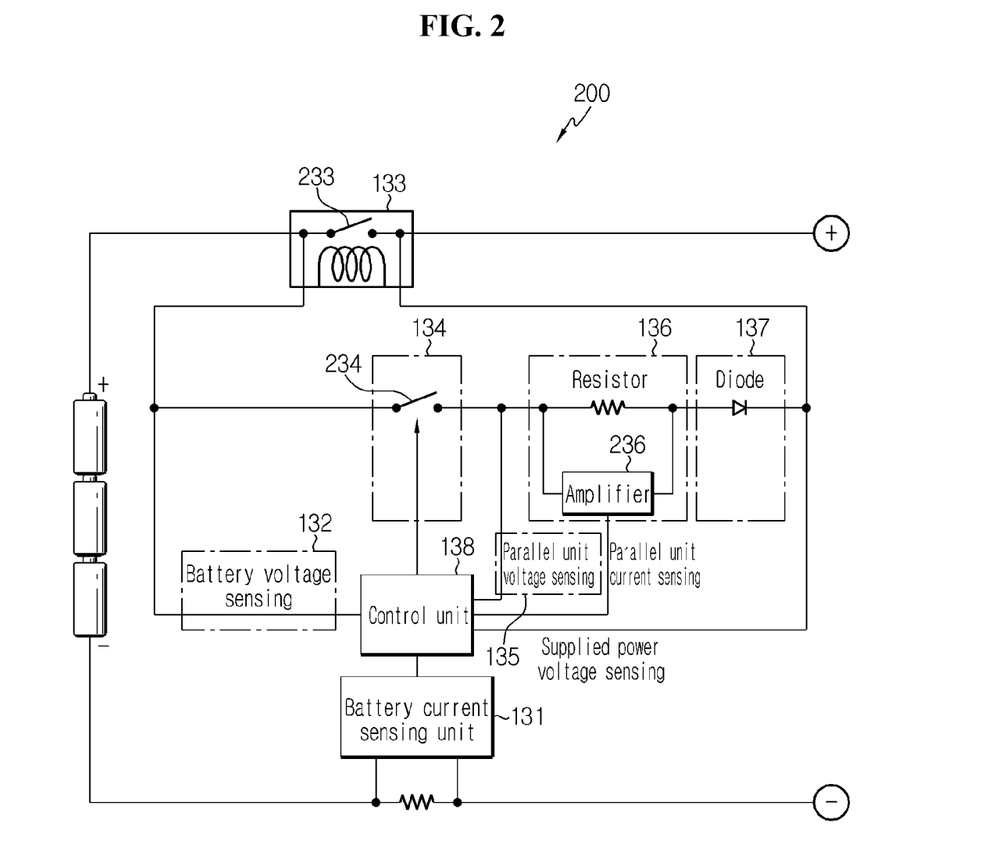
FIG. 2 is a schematic internal configuration diagram of a BMS apparatus corresponding to the apparatus of FIG. 1.

FIG. 2 is a schematic internal configuration diagram of the BMS apparatus 200 corresponding to the apparatus 130 of FIG. 1.

The battery current sensing unit 131 senses the current flowing through the battery 101, and outputs the sensed current to the control unit 138. The battery current sensing unit 131 may be positioned at a circuit connected to the negative electrode of the battery 101. The battery current sensing unit 131 may be implemented in the BMS apparatus 200 as an IC circuit that senses the current of the battery 101.

The battery voltage sensing unit 132 senses the voltage outputted from the battery 101, and outputs the sensed voltage to the control unit 138. The battery voltage sensing unit 132 may be positioned at a circuit connected to the positive electrode of the battery 101. The battery voltage sensing unit 132 may be implemented in the BMS apparatus 200 as a circuit that senses the voltage of the battery 101.

The relay unit 133 includes a bistable relay switch 233 and a coil. The relay unit 133 is positioned at a circuit connected to the positive electrode of the battery 101. The relay unit 133 switches the switch 233 to open (switch off) or closed (switch on) state according to a control signal received from the control unit 138. The relay unit 133 in closed state is a power supply path along which the current of the battery 101 flows to the vehicle 151.

For reference, after applying an ON signal, a bistable relay remains in ON state even when the signal is stopped. In contrast, after applying an ON signal, a monostable relay of a high voltage relay returns to OFF state when the signal is stopped.

The parallel unit 134 includes a switch 234 (e.g., a field effect transistor (FET) switch). The parallel unit 134 is connected to the input terminal and the output terminal of the relay unit 133 as a parallel circuit. The range of the parallel circuit starts from the input terminal of the relay switch 233 and ends in the output terminal of the relay switch 233 through the parallel unit 134, the parallel unit voltage sensing unit 135, the parallel unit current sensing unit 136 and the diode unit 137. The parallel unit 134 switches the switch 234 to open or closed state according to the control signal received from the control unit 138. Instead of the relay unit 133 in open state having stopped the power supply, the parallel unit 134 allows the current of the battery 101 to flow to the vehicle 151 in closed state of the switch 234. Thus, the current of the battery 101 flows to the vehicle 151 through the path of the parallel circuit range.

The parallel unit voltage sensing unit 135 senses the voltage outputted from the parallel unit 134, and outputs the sensed voltage to the control unit 138. The parallel unit voltage sensing unit 135 may be positioned at the output circuit of the parallel unit 134. The parallel unit voltage sensing unit 135 may be implemented in the BMS apparatus 200 as a circuit that senses the output voltage of the parallel unit 134.

The parallel unit current sensing unit 136 senses the current that is outputted from the parallel unit 134 and flows to the vehicle 151, and outputs the sensed current to the control unit 138. The parallel unit current sensing unit 136 may be positioned at the output circuit of the parallel unit 134. The parallel unit current sensing unit 136 may be implemented in the BMS apparatus 200 as an IC circuit that senses the output current of the parallel unit 134.

The diode unit 137 may be positioned at the output circuit of the parallel unit 134 to prevent the backward current and the backward voltage. The current outputted from the parallel unit 134 in closed state flows through the diode unit 137, the backward current and the backward voltage is prevented, damage of the circuit component is prevented and stability of the parallel circuit is guaranteed.

For constant power supply, the control unit 138 controls from normal state to first state in which the relay unit 133 is in closed state and the parallel unit is in open state. After the control unit 138 controls into first state, the control unit 138 periodically determines whether to start determining a failure of the relay switch 233.

Preferably, not to give stress to the main function of the BMS apparatus 200, when the current of the battery 101 in the first state outputted from the battery current sensing unit 131 is equal to or less than a preset current, the control unit 134 starts the processing for diagnosing a failure of the relay switch 233. For example, the control unit 138 determines if the condition of the preset current or less is satisfied at a preset interval (e.g., 60 seconds). In the case of the vehicle 151, when the current of the battery 101 equal to or less than the preset current (e.g., 10 mA) is sensed, the vehicle may be determined to be in parking state. Of course, a preset current for determining the parking state is set in the BMS apparatus 200 in response to the limitation condition such as the vehicle type, manufacturer and battery.

When the condition of the preset current or less is satisfied, the control unit 138 starts determining the first state. First, when the voltage and the current outputted from the parallel unit voltage sensing unit 135 and the parallel unit current sensing unit 136 is 0, the control unit 138 determines the first state to be normal state, and controls into second state in which the relay unit 133 is in closed state and the parallel unit 134 is in closed state. In the first state, because the current of the battery 101 flows to the vehicle 151 through the relay unit 133, the first state is determined to be normal state when the voltage and the current sensed at the output terminal of the parallel unit 134 is nearly 0.

The control unit 138 outputs a closed control signal to the parallel unit 134 by the control of the second state, and the parallel unit 134 switches the switch 234 to closed state according to the received control signal. In the second state, the relay unit 133 is maintained in closed state and the parallel unit 134 is switched to closed state.

In the second state, the control unit 138 receives the output of the voltage of the parallel unit 134 from the parallel unit voltage sensing unit 135, and receives the output of the current of the parallel unit 134 from the parallel unit current sensing unit 136. When the output voltage is equal to the voltage of the battery larger than 0 and the output current is 0, the control unit 138 determines the second state to be normal state and controls into third state.

In the second state determined to be normal state, because the switch 234 is in closed state, the control unit 138 receives the input of the voltage of the parallel unit (voltage of the battery) larger than 0 from the parallel unit voltage sensing unit 135. The voltage sensed from the parallel unit voltage sensing unit 135 is equal to the voltage sensed from the battery voltage sensing unit 132. Additionally, because the resistance of the relay unit 133 is smaller than the resistance of the parallel unit 134 and the current of the battery 101 flows through the relay unit 133, the current sensed through the parallel unit current sensing unit 136 is 0. If the current sensed through the parallel unit current sensing unit 136 is not 0, because the current flows through the parallel unit 134, the control unit 138 determines that the relay switch 233 is faulty in eternal open state and cannot be switched to closed state.

The control unit 138 outputs an open control signal to the relay unit 133 by the control of the third state, and the relay unit 133 switches the switch 233 to open state according to the received control signal. In the third state, the relay unit 133 is switched to open state, and the parallel unit 134 is maintained in closed state.

In the third state, the control unit 138 receives the output of the voltage of the parallel unit 134 from the parallel unit voltage sensing unit 135, and receives the output of the current of the parallel unit 134 from the parallel unit current sensing unit 136. When the output voltage of the parallel unit 134 is equal to the voltage of the battery voltage sensing unit 132 and the output current of the parallel unit 134 is equal to the current of the battery current sensing unit 131, the control unit 138 determines that the relay switch 233 is normal and the third state to be normal state.

In the third state determined to be normal state, because only the switch 234 is in closed state, the current of the battery 101 only flows through the range of the parallel circuit. Thus, the voltage sensed from the parallel unit voltage sensing unit 135 is equal to the voltage sensed from the battery voltage sensing unit 132. Additionally, because the current of the battery 101 flows through the parallel unit 134, not the relay unit 133 in open state, the current sensed through the parallel unit current sensing unit 136 is equal to the current of the battery current sensing unit 131 larger than 0. If the current sensed through the parallel unit current sensing unit 136 is 0 but not equal to the current of the battery current sensing unit 131, because the current does not flow through the parallel unit 134, the control unit 138 determines that the relay switch 233 is faulty in eternal closed state (e.g., relay welding) and cannot be switched to open state.

Figure 3:
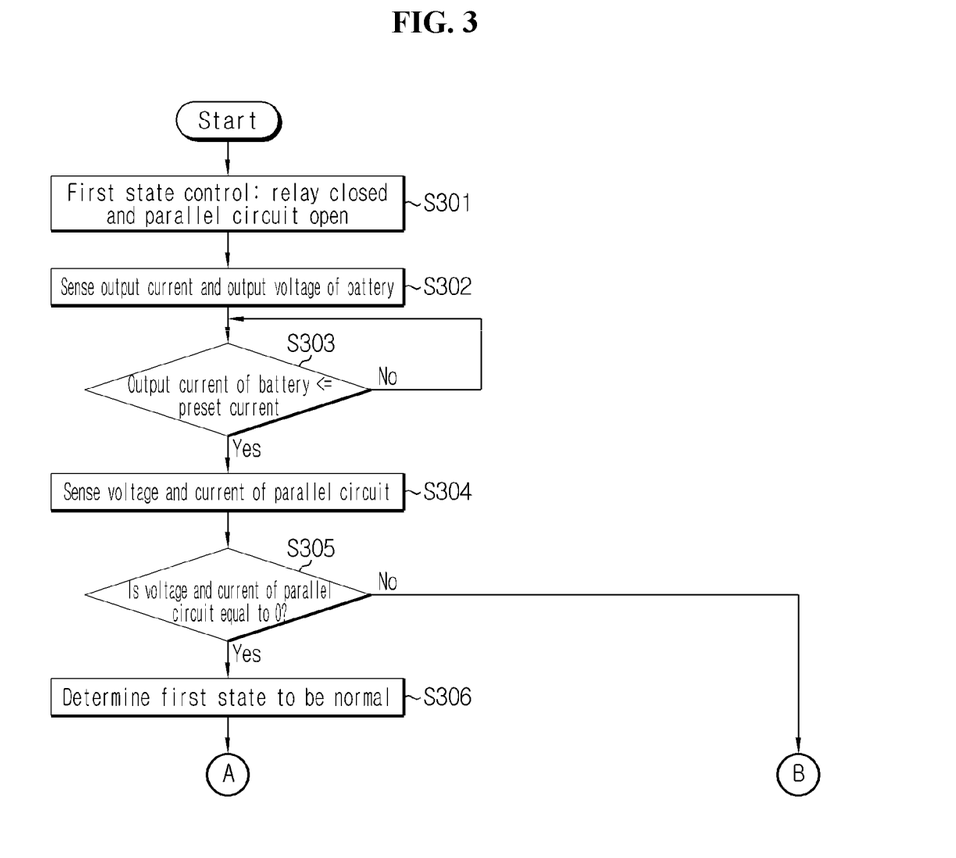
FIGS. 3 to 5 are schematic flowcharts of a relay diagnosis method according to an embodiment of the present disclosure.
Figure 4:
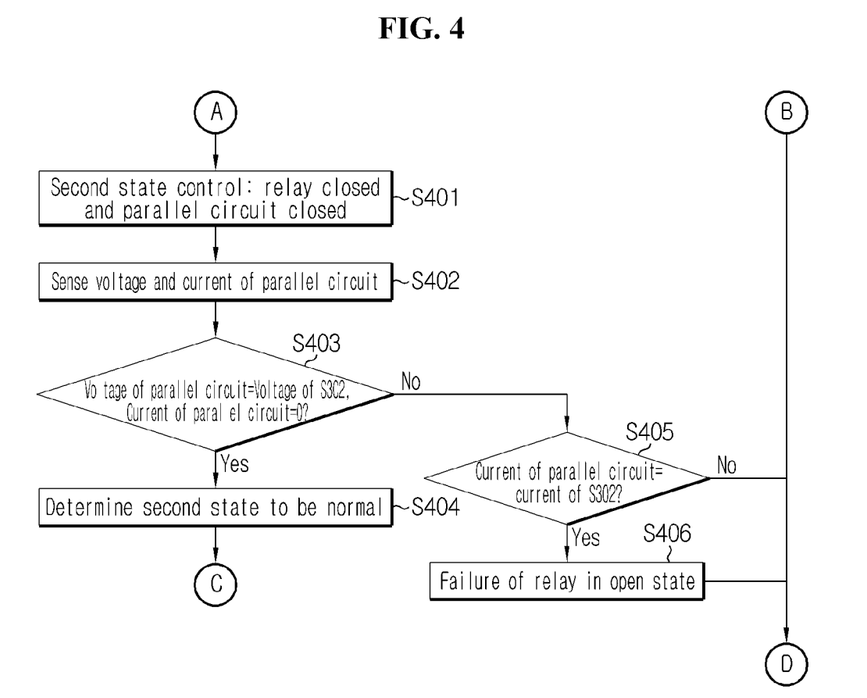
Figure 5:
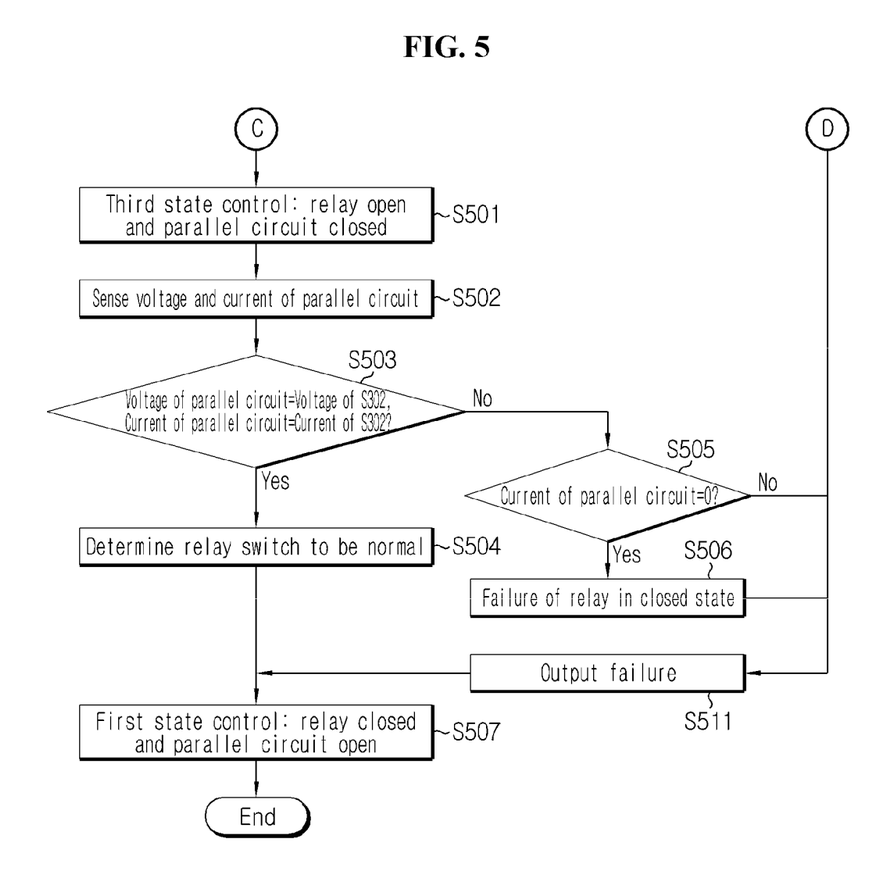

FIGS. 3 to 5 are schematic flowcharts of a relay diagnosis method according to an embodiment of the present disclosure. FIG. 3 is a flowchart showing the apparatus 130 controlling first state, FIG. 4 is a flowchart showing the apparatus 130 controlling second state, and FIG. 5 is a flowchart showing the apparatus 130 controlling third state.

Referring to FIG. 3, after the battery 101 is connected to a load device such as the vehicle 151, the apparatus 130 controls into first state in which the switch 233 of the relay is in closed state and the switch 234 of the parallel circuit is in open state (S301). The apparatus 130 senses the output voltage and the output current of the battery from the circuit of the battery (S302). To diagnose a failure of the relay switch 233, the apparatus 130 determines if the sensed current of the battery is equal to or less than a preset current (S303). Then the apparatus 130 senses a voltage and current of the parallel circuit (S304).

Preferably, to protect the main function of the apparatus 130, the preset current is preferably a minimum current for sensing an idle state of the apparatus. For example, when the main function is to constantly supply the power from the battery 101 to the vehicle 151 by the BMS apparatus 200, a minimum current for determining a parking state in which the ECU system where a minimum current is consumed in the vehicle 151 is powered off is set in the BMS apparatus 200.

When it is determined that the current of the preset current or less is consumed through the apparatus 130, the apparatus 130 starts diagnosing the switch 233. First, the apparatus 130 determines if the output voltage and the output current of the parallel circuit is 0 (S305). When the output voltage and the output current is determined to be 0, the apparatus 130 determines the first state to be normal, and starts controlling into second state (S306). In the first state, because the current flows through the relay circuit and the parallel switch 234 is open, the voltage and the current of the parallel circuit should be sensed as 0.

Referring to FIG. 4, the apparatus 130 controls into second state in which the relay switch 233 is in closed state and the switch 234 of the parallel circuit is switched to closed state (S401). The apparatus 130 senses the output voltage and the output current from the parallel circuit (S402). The apparatus 130 determines if the sensed voltage of the parallel circuit is the battery voltage, and the sensed current of the parallel circuit is 0 (S403). In the second state, the relay switch 233 and the parallel switch 234 are in closed state, and the current flows through the relay switch 233 with low resistance. Thus, the same voltage as the battery voltage is sensed from the parallel circuit, while the sensing current should be 0. When the condition of voltage and current is satisfied, the apparatus 130 determines the second state to be normal (S404). When the second state is determined to be normal, control into third state starts.

The apparatus 130 compares the current of the parallel circuit and the battery current (S405), and when they are determined to be equal, the relay switch 233 is diagnosed as being in open state in which the battery current flows in the parallel circuit and eventually, in eternal failure state (S406).

Referring to FIG. 5, the apparatus 130 controls into third state in which the relay switch 233 is switched to open state and the switch 234 of the parallel circuit is maintained in closed state (S501). The apparatus 130 senses the output voltage and the output current from the parallel circuit (S502). The apparatus 130 determines if the sensed voltage of the parallel circuit is the battery voltage and the sensed current of the parallel circuit is the battery current (S503). In the third state, due to the open relay switch 233, the current of the battery 101 flows to the vehicle 151 through the parallel switch 234. Thus, in the parallel circuit, the same voltage as the battery voltage should be sensed, and the same current as the battery current should be sensed. When the condition of voltage and current is satisfied, the apparatus 130 determines the third state to be normal (S504) and returns to the control of normal state of the first state (S507).

When the apparatus 130 senses the current of the parallel circuit as 0 (S505), the apparatus 130 determines that the current does not flow in the parallel circuit and the current flows through the relay circuit controlled into open, and diagnoses the relay switch 233 as eternal failure state in welded state (S506).

Additionally, the open failure, closed failure and other failures of the relay switch 233 diagnosed by the apparatus 130 are outputted to the ECU system of the vehicle to provide notification to the driver (S511).

While the present disclosure is described with respect to a limited number of embodiments and drawings, the present disclosure is not limited thereto and it is obvious to those having ordinary skill in the technical field pertaining to the present disclosure that various changes and modification may be made thereto within the equivalent scope of the technical aspects of the present disclosure and the appended claims.

What is claimed is:

1. An apparatus, comprising:
a relay unit including a switch;
a parallel unit including a switch; and
a control unit which controls into first state in which the relay unit is in closed state and the parallel unit is in an open state, and when voltage and current of the parallel unit is 0 in the first state, controls into second state in which the relay unit is in closed state and the parallel unit is in closed state, and when the voltage of the parallel unit is equal to voltage of a battery and the current of the parallel unit is 0 in the second state, controls into third state in which the relay unit is in open state and the parallel unit is in closed state, and when the current of the parallel unit is equal to current of the battery and the voltage of the parallel circuit is equal to voltage of the battery in the third state, determines the switch of the relay unit to be normal, and when the current of the parallel unit is 0, determines the switch of the relay unit to be faulty,
wherein the relay unit switches the switch of the relay unit to open or closed state by control of the control unit, the relay unit through which the current of the battery flows in closed state to supply power, and
wherein the parallel unit switches the switch of the parallel circuit to open or closed state by control of the control unit, and applies the current of the battery in closed state instead of the relay unit in open state in which the supply of power is stopped;
a parallel unit voltage sensing unit which senses the voltage of the parallel unit and outputs the same to the control unit; and
a parallel unit current sensing unit which senses the current of the parallel unit and outputs the same to the control unit.

2. The apparatus according to claim 1, further comprising:
a battery current sensing unit which senses the current of the battery and outputs the same to the control unit,
wherein when the control unit determines that the current of the battery received in the first state is equal to or less than a preset current, the control unit starts determining whether to control into the second state.

3. The apparatus according to claim 2, wherein the apparatus is a Battery Management System (BMS) apparatus of an automotive battery installed in a vehicle, and
when the received current of the battery is equal to or less than the preset current, the control unit determines that the vehicle is in parking state, and starts determining whether to control into the second state.

4. The apparatus according to claim 1, wherein the control unit controls the relay unit into closed state to maintain constant power supply of the battery, and
if necessary, in a state that the control unit controls the parallel unit into closed state, the control unit controls the relay unit into open state.

5. The apparatus according to claim 1, wherein when the control unit determines that the current of the parallel unit is not 0 in the controlled second state, the control unit determines that the switch of the relay unit is faulty in eternal open state.

6. The apparatus according to claim 1, further comprising:
a battery voltage sensing unit which senses the voltage of the battery and outputs the same to the control unit,
wherein when the voltage of the parallel unit is equal to the voltage of the battery and the current of the parallel unit is 0 in the controlled second state, the control unit determines the second state to be normal.

7. The apparatus according to claim 6, wherein in the second state, because resistance of the relay unit is smaller than resistance of the parallel unit and the current of the battery flows through the relay unit, the sensed current of the parallel unit is 0.

8. The apparatus according to claim 1, wherein the control unit receives inputs of voltage and current of the parallel unit in the controlled third state, and when the voltage of the parallel unit is equal to the voltage of the battery and the current of the parallel unit is equal to the current of the battery, the control unit determines the third state to be normal.

9. The apparatus according to claim 8, wherein in the third state, because the current of the battery flows through the parallel unit instead of the relay unit in open state, the current of the parallel unit is equal to the current of the battery.

10. The apparatus according to claim 1, wherein when the current of the parallel unit is not equal to the current of the battery in the third state, the control unit determines that the switch of the relay unit is faulty in eternal closed state.

11. The apparatus according to claim 1, further comprising:
a diode unit connected to the parallel unit to prevent backward voltage,
wherein the current outputted from the parallel unit flows to an output terminal of the relay unit through the diode unit.

12. A battery management system (BMS) apparatus for diagnosing a failure of a relay required for constant power output of a battery, the BMS apparatus comprising:
a relay circuit including a switch;
a parallel circuit including a switch; and
a control unit which controls into first state in which the relay circuit is in closed state and the parallel circuit is in open state, and when voltage and current of the parallel circuit is 0 in the first state, controls into second state in which the relay circuit is in closed state and the parallel circuit is in closed state, and when the voltage of the parallel circuit is equal to voltage of the battery and the current of the parallel circuit is 0 in the second state, controls into third state in which the relay circuit is in open state and the parallel circuit is in closed state, and when the current of the parallel circuit is equal to a current of the battery and the voltage of the parallel circuit is equal to voltage of the battery in the third state, determines a switch of the relay circuit to be normal, and when the current of the parallel circuit is 0, determines the switch of the relay circuit to be faulty
wherein the relay circuit switches the switch of the relay circuit to open or closed state by control of the control unit, the relay circuit through which the current of the battery flows in closed state to supply the power, and
wherein the parallel circuit is connected to an input terminal of the relay circuit, the parallel circuit switches the switch of the parallel circuit to open or closed state by control of the control unit, and applies the current of the battery in closed state instead of the relay circuit in which the supply of power is stopped;
a voltage sensing circuit connected to an output terminal of the parallel circuit to sense the voltage of the parallel circuit and outputs the same to the control unit; and
a current sensing circuit connected to the output terminal of the parallel circuit to sense the current of the parallel circuit and outputs the same to the control unit.

13. A method for diagnosing a failure of a relay required for constant power output by an apparatus, the method comprising:
controlling into first state in which a switch of a relay circuit is in closed state and a switch of a parallel circuit is in open state;
determining the first state to be normal when the sensed voltage and current of the parallel circuit is 0 in the controlled first state;
controlling into second state in which the relay circuit is in closed state and the parallel circuit is in closed state when the first state is determined to be normal;
determining the second state to be normal when the sensed voltage of the parallel circuit is equal to voltage of a battery and the current of the parallel circuit is 0 in the controlled second state;
controlling into third state in which the relay circuit is in open state and the parallel circuit is in closed state when the second state is determined to be normal;
determining the switch of the relay circuit to be normal when the sensed current of the parallel circuit is equal to a current of the battery and the voltage of the parallel circuit is equal to voltage of the battery in the controlled third state; and
determining the switch of the relay circuit to be faulty when the current of the parallel circuit is 0.

* * * * *